United States Patent [19]
Sakamoto

[11] Patent Number: 6,137,717
[45] Date of Patent: Oct. 24, 2000

[54] NONVOLATILE MEMORY AND WRITING CIRCUIT FOR SAME

[75] Inventor: Yasuhiko Sakamoto, Nara-ken, Japan

[73] Assignee: Sharp Kabushiki Kaisha, Osaka, Japan

[21] Appl. No.: 09/203,304

[22] Filed: Dec. 1, 1998

[30]     Foreign Application Priority Data

Dec. 5, 1997   [JP]   Japan ..................... 9-335797

[51] Int. Cl.[7] ................................ G11C 16/04
[52] U.S. Cl. ................ 365/185.03; 365/185.22
[58] Field of Search ............. 365/230.08, 189.05, 365/185.22

[56]           References Cited

U.S. PATENT DOCUMENTS

| | | | |
|---|---|---|---|
| 4,811,294 | 3/1989 | Kobayashi et al. | 365/189 |
| 5,377,145 | 12/1994 | Kynett et al. | 365/189.05 |
| 5,784,315 | 7/1998 | Itoh | 365/185.22 |

FOREIGN PATENT DOCUMENTS 5-290585   5/1993   Japan .

*Primary Examiner*—David Nelms
*Assistant Examiner*—Connie C. Yoha
*Attorney, Agent, or Firm*—Morrison & Foerster, LLP

[57]              ABSTRACT

A writing circuit for a nonvolatile memory has eight circuit units for bit parallel processing. Each circuit unit has 16 first D flip-flops for address 0 to address F, and one second D flip-flop. The eight circuit units hold in their own 16 first D flip-flops write data of 8 bits fed in bit parallel fashion with respect to each of the 16 addresses. The totally eight second D flip-flops simultaneously hold 8 bits of verify data read from memory cells in bit parallel fashion. In verify operation, in each of the eight circuit units, the write data held in the first D flip-flops are given 16 address attributes, respectively, and compared with the verify data held by the second D flip-flop in an address sequence of the 16 address attributes to make sure of coincidence between the data.

5 Claims, 6 Drawing Sheets

Fig. 4A Aad (High Order)
Fig. 4B Rad
Fig. 4C Indata-0
Fig. 4D DCK
Fig. 4E Write Pulse

6,137,717

NONVOLATILE MEMORY AND WRITING CIRCUIT FOR SAME

BACKGROUND OF THE INVENTION

The present invention generally relates to erasable programmable nonvolatile memories and, more particularly, to a writing circuit for such memories capable of writing data for a plurality of addresses as a batch to a plurality of memory cells in parallel.

For nonvolatile memories, especially of flash memory type, it is necessary to finely control the memory's threshold values for write/erase operations with a view to maintaining the reliability during long-time use. It is also necessary to reduce damage to the memory cells by minimizing write pulses.

Meanwhile, in order to meet longer write/erase times due to increased capacities of memories, particularly for write operation, a technique of writing to a plurality of memory cells in one batch is adopted.

In a known batch writing technique, parallel input/output is executed for a plurality of memory cells, and the processing is done with the plurality of cells taken as one address. In this technique, the writing to the plurality of cells of the address is completed at a time when the writing of the slowest bit, which needs the largest number of write pulses, ends.

However, in this parallel write operation, when the number of pulses necessary for write operation differs from bit to bit, i.e., from memory cell to memory cell, the following problem would be involved in writing operation in which a plurality of memory cells are taken as one address.

That is, because the parallel processing is done for a plurality of bits, there is a possibility that write pulses more than necessary are applied to memory cells corresponding to bits other than the slowest bit. That is, excessive writing may be done on the bits other than the slowest bit. This excessive writing is quite disadvantageous in view of the aforementioned threshold-value control of write cells and the retention of reliability.

Thus, in order to mend this disadvantage, verify process is performed for each bit even in the parallel processing of a plurality of bits, by which the application of additional pulses is controlled. The following techniques (1) and (2) are available as a technique for controlling the application of additional pulses:

(1) Based on verify data, write data is processed and reset so that only bits that need additional pulses are left, and additional write operation is continued until the writing of all the bits under parallel processing is completed. This processing is performed by a processing unit, such as a microcomputer built in the nonvolatile memory or installed outside of it;

(2) Data is reset without the aid of the processing unit and additional write operation is continued. One example of this technique is disclosed in Japanese Patent Laid-Open Publication HEI 5-290585. In this example disclosed, parallel processing of a plurality of bits is restricted to progression by steps of one address, so that simultaneous processing of a plurality of bits and of a plurality of addresses responsive to recent days' large capacities could not be performed. As a result, there is a problem that, in proportion to the increase in the memory size, the write time as a whole is prolonged.

As shown in the prior art example, as the write operation of a plurality of bits is performed by steps of one address, namely, address by address, the write time of the whole memory is increased especially in the case of a large-capacity memory, which may incur an inconvenience in use.

Also, with the write operation by the address, it is more likely that the total number of write pulses involved in writing to the full memory becomes larger, as compared with the batch writing of a plurality of addresses.

As a result of this, memory cells other than those that have been selected for application of write pulses would undergo write disturb for a long time, leading to an increase in variations of the write-cell threshold value. Moreover, increased stress on the memory cells may adversely affect the reliability of the memory cells.

Particularly in the case of flash memory type nonvolatile memories, memory cells other than a write memory cell that is being written are fed with a weak write bias, resulting in write disturb. One example of this is explained with reference to FIG. 6. In FIG. 6, if a cell 5 is written, a voltage VPP (V) is applied to the cell drain as a write bias, while a voltage of 0 V is applied to the cell gate. In this case, for a cell 2 and a cell 8 on the same word line (WL1) as the cell 5, a voltage of ½ VPP (V) is applied to the cell drain, while a voltage of 0 V is applied to the cell gate, so that a weak write bias of potential difference ½ VPP is applied. At this point, if the cell 2 and the cell 8 have been in an erased state, the cell 2 and the cell 8 change to a written state, thus resulting in deteriorated reliability with respect to the state retention of the cells 2, 8.

Likewise, with respect to a cell 4 and a cell 6 on the same bit line (BL1) as the cell 5, a voltage of VPP is applied to the cell drain while a voltage of ½ VPP is applied to the cell gate, so that a weak write bias with potential difference ½ VPP is applied. As a result, the cells 4, 6 are adversely affected like the cells 2, 8. This adverse effect is the write disturb. The total amount of this disturb is given by the product of the magnitude of the bias that makes disturb (aforesaid ½ VPP) and the time during which the cells undergo the disturb. The time during which the cells undergo the disturb is the time during which write pulses are fed.

Therefore, write operation on the 1-address basis requiring a longer total write pulse time would involve more write disturb than write operation in batches of a plurality of addresses requiring a shorter total write pulse time.

SUMMARY OF THE INVENTION

Accordingly, a main object of the present invention is to provide a writing circuit for a nonvolatile memory capable of executing high-reliability write operations in a short time even though the memory has a large capacity.

In order to accomplish the above object, the present invention provides a writing circuit for nonvolatile memory capable of performing data input/output in M-bit parallelism (where M is an integer), comprising:

M data latch assemblies which each include N first data latches for N addresses (where N is an integer);

first control means for controlling the M data latch assemblies to hold in the first data latches M bits of write data fed in bit parallel fashion with respect to each of the N addresses, respectively;

M second data latches for simultaneously holding verify data of M bits read from memory cells; and means for generating an address decode signal by which each of the parallel M bits of write data is given N address attributes, respectively, in a verify operation.

According to the present invention, the M data latch assemblies are controlled by the first control means to hold in their respective N first data latches the M-bit write data for N addresses from the first address to the Nth address in bit-parallel fashion. Meanwhile, the M second data latches simultaneously hold M bits of verify data read from the memory cells. Then, in a verify operation, the means for generating an address decoding signal imparts different address attributes to the write data held in the N first data latches of each latch assembly, respectively.

Accordingly, with respect to the memory cells corresponding to the data held in the totally M×N first data latches, the permission or inhibition as to the application of a write pulse to the memory cells is specified. Thus, it is possible to simultaneously write to N addresses of the memory in M-bit parallelism so that the write process is accomplished in a short time even though the memory has a large capacity.

Here is a comparison of the total number of write pulses, as an example, between a prior-art case in which write operation to three addresses is executed by steps of one address and a case of the present invention in which 3-address-batch write operation is executed. Now let the 3 addresses be address 0, address 1 and address 2 and let the write pulse counts required for these addresses be 2 for address 0, 3 for address 1 and 3 for address 2. In this case, in the prior art write operation by the address, namely address by address, the total write pulse count for writing 3 addresses is a sum of the write pulse counts required by the individual addresses, i.e., 2+3+3=8.

Meanwhile, in the 3-address-batch write operation using the present invention, the total write pulse count for writing 3 addresses is equal to a maximum value of the write pulse counts required by the individual addresses, i.e., 3.

Like this example, in the plural-address-batch write operation, the total number of write pulses is smaller, compared with the write operation by the address.

In one embodiment, the writing circuit further includes second control means for comparing M×N pieces of write data held by the M×N first data latches with the verify data of M bits held by the M second data latches in an address sequence of the N address attributes and in M-bit parallelism, determining whether or not the write data is coincident with the verify data, and with respect to a first data latch that is holding the write data coincident with the verify data, canceling the holding of the write data and inhibiting the generation of a write pulse.

In this embodiment, excessive writing as in the prior art is prevented. Therefore, according to the present invention, highly reliable write operation is accomplished in a short time even for large-capacity memories.

According to another aspect of the present invention, there is provided a nonvolatile memory including the writing circuit as described above.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
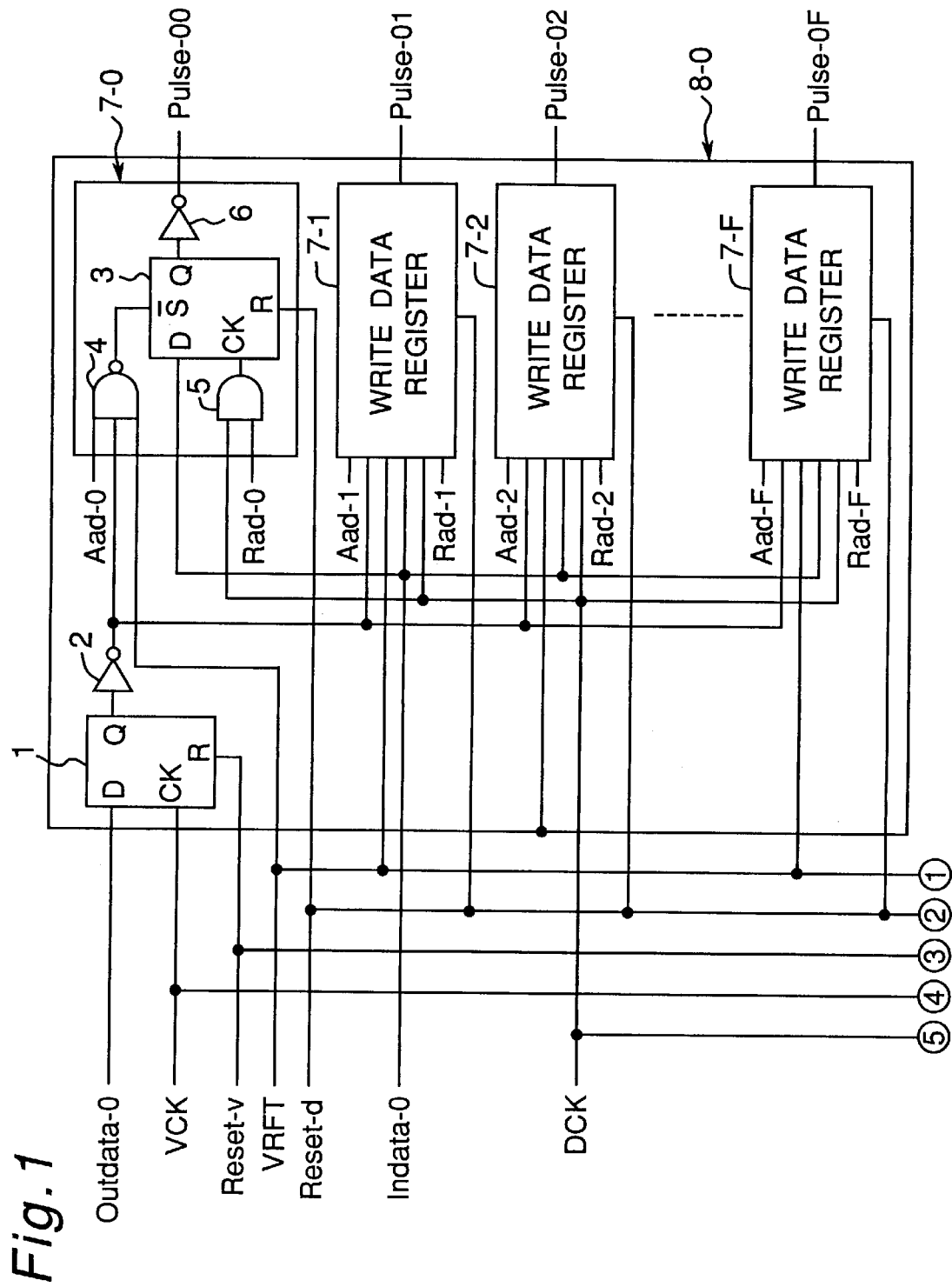
FIG. 1 is a partial circuit diagram of an embodiment of the writing circuit for nonvolatile memory according to the present invention.
Figure 2:
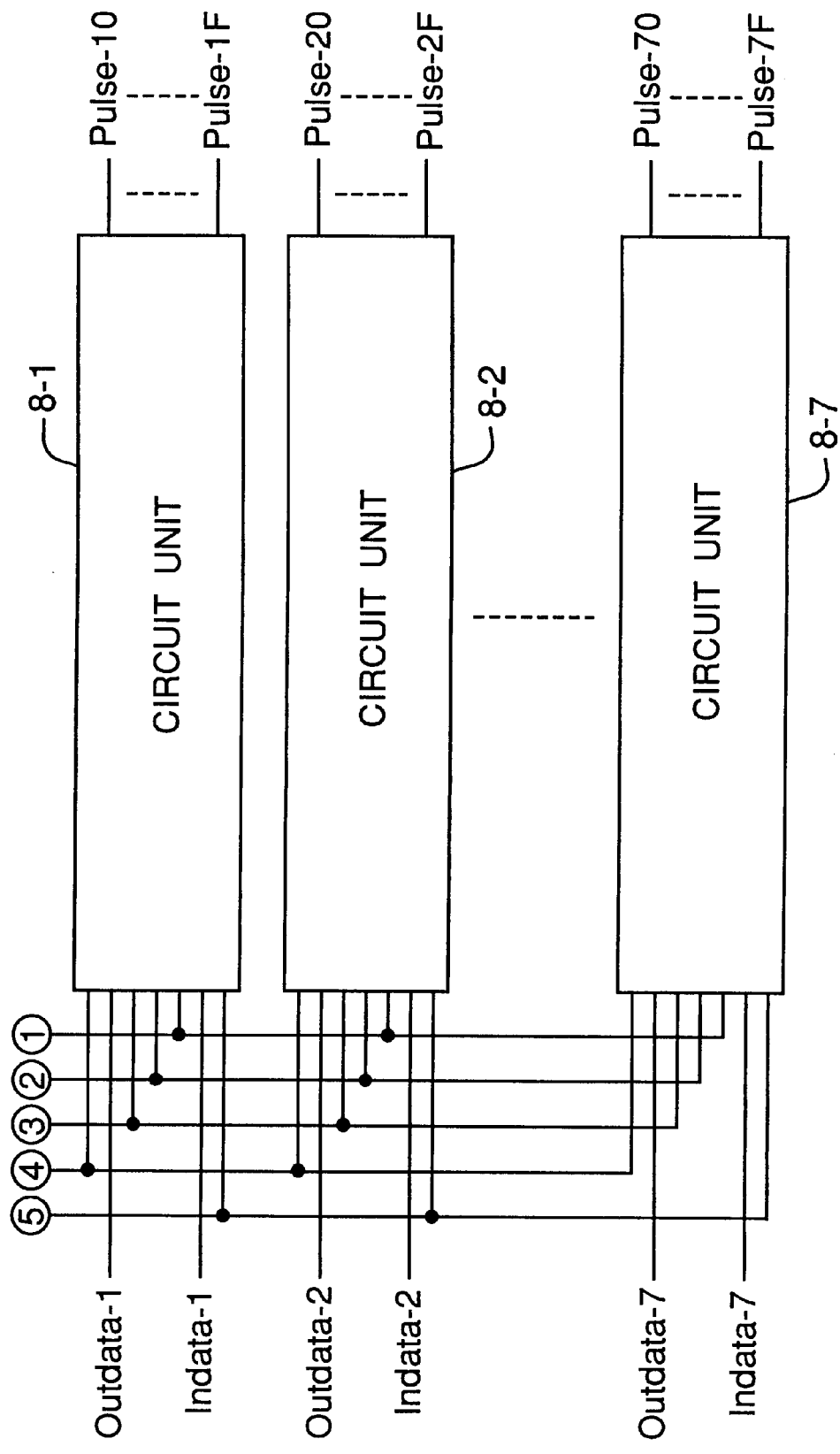
FIG. 2 shows another part of the circuit diagram.

FIGS. 1 and 2 show a writing circuit for a nonvolatile memory as an embodiment of the present invention. Five lines (1), (2), (3), (4), (5) of FIG. 1 are connected to five lines (1), (2), (3), (4), (5) of FIG. 2, respectively.

The writing circuit processes eight bits of Indata 0 to Indata 7 in parallel, and writes the data to memory cells corresponding to sixteen addresses (address 0 to address F) as a batch.

As shown in FIGS. 1 and 2, the writing circuit includes eight circuit units 8-0 to 8-7. These eight circuit units 8-0 to 8-7 receive Outdata 0 to Outdata 7, respectively, which are output data from a memory reading circuit (not shown) Also, the circuit units 8-0 to 8-7 receive Indata 0–Indata 7, respectively, which are write data coming from outside of the nonvolatile memory. Further, the circuit units 8-0 to 8-7 receive, as common signals, a latch clock signal VCK, a reset signal Reset-v, a data processing timing signal VRFT and a reset signal Reset-d. The timing signal VRFT is a signal indicating the timing to process the write data for additional writing in the verify operation.

The circuit units 8-0 to 8-7 are of the same circuit structure, each having sixteen write data registers 7-0 to 7-F which constitute the data latch assembly as set forth in the claims. These sixteen write data registers 7-0 to 7-F are of the same circuit structure, serving also as verify data comparators.

FIG. 1 shows in detail the structure of the circuit unit 8-0. This circuit unit 8-0 has a D flip-flop 1 and an inverter 2 connected to a terminal Q of the D flip-flop 1. The inverter 2 is connected to a NAND gate 4 with which the write data registers 7-0 to 7-F are equipped. The D flip-flop 1 serves to hold data output from the memory cells for verify purpose.

The latch clock signal VCK is input to a terminal CK of the D flip-flop 1, while the reset signal Reset-v is input to a terminal R. Also, decode signals Aad-0 to Aad-F indicating absolute addresses of the nonvolatile memory as well as decode signals Rad-0 to Rad-F showing local addresses are input to the sixteen write data registers 7-0 to 7-F, respectively. The decode signals Rad-0 to Rad-F are signals representing the order in which data are stored in the write data registers 7-0 to 7-F.

The structure of the write data register 7-0 is shown in detail in FIG. 1. The write data register 7-0 has the NAND gate 4, an AND gate 5, a D flip-flop 3 and an inverter 6. An output terminal of the NAND gate 4 is connected to a terminal S of the D flip-flop 3. The NAND gate 4 is fed with the absolute address Aad-0, an output of the inverter 2 and the timing signal VRTF. Also, an output terminal of the AND gate 5 is connected to a terminal CK of the D flip-flop 3. The AND gate 5 is fed with a latch timing signal DCK and the local address Rad-0. The latch timing signal DCK is a signal representing the timing for latching the write data. Also, a terminal R of the D flip-flop 3 is fed with the reset signal Reset-d.

The writing circuit for nonvolatile memory as shown in FIGS. 1 and 2 is equipped with a total of 128 circuits of the same structure as the write data register 7-0 that serve also as a verify data comparator, the number 128 being calculated from "number of circuit units 8-0 to 8-7 correspondent to the number of parallel bits to be written as a batch, i.e. 8" by "number of write data registers 7-0 to 7-F correspondent to the number of batch addresses, i.e. 16."

In this writing circuit for nonvolatile memory according to this embodiment, the eight circuit units 8-0 to 8-7 deliver the following 128 signals: Pulse-00 to Pulse-0F, Pulse-10 to Pulse-1F, Pulse-20 to Pulse-2F, Pulse-30 to Pulse-3F, Pulse-40 to Pulse-4F, Pulse-50 to Pulse-5F, Pulse-60 to Pulse-6F, and Pulse-70 to Pulse-7F. These output signals Pulse-00 to Pulse-7F are usable as write-pulse enable signals, wherein a write pulse becomes applicable when these output signals are "1".

Figure 3:
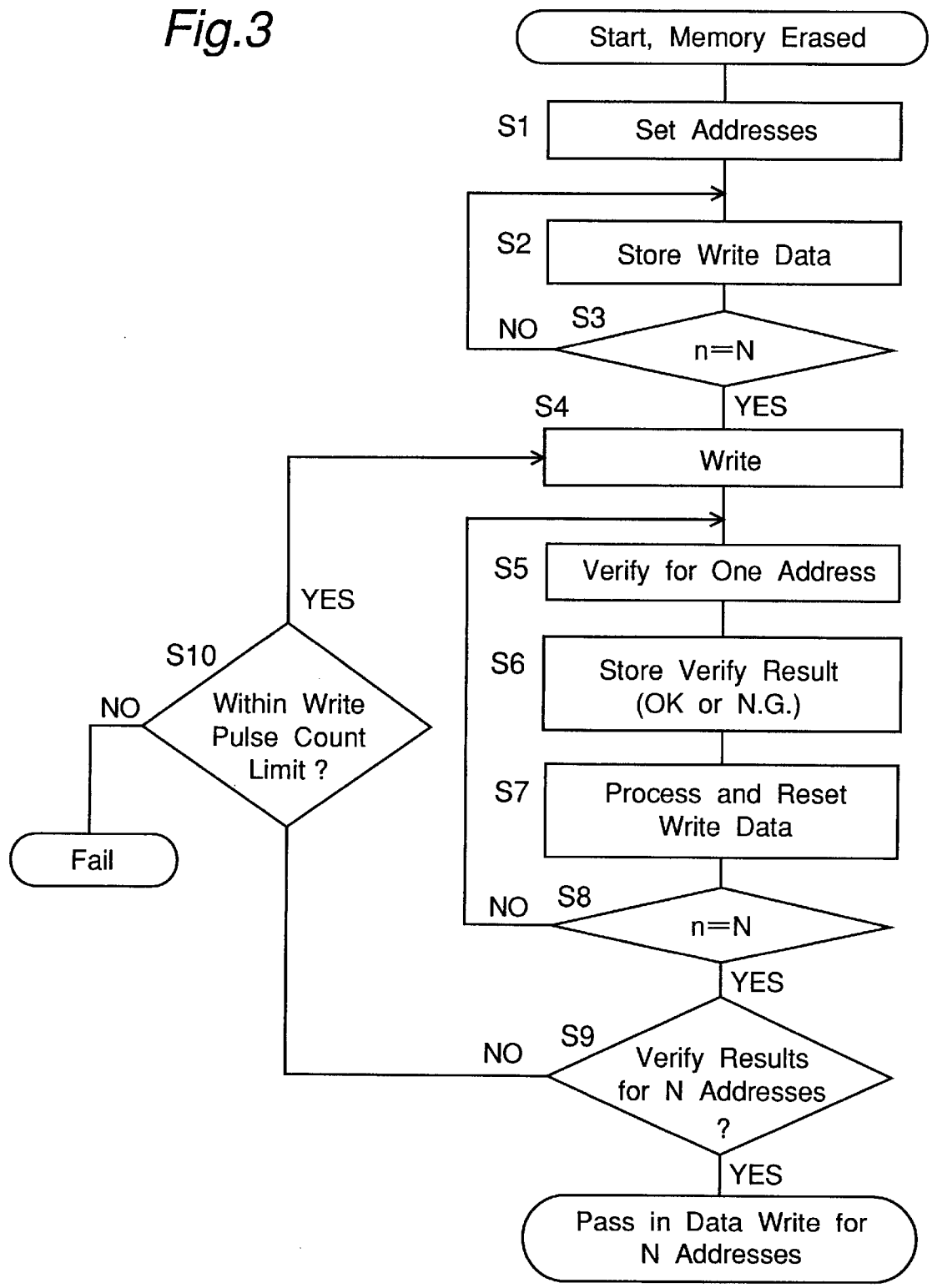
FIG. 3 is a flow chart of the write operation for N addresses in a nonvolatile memory using this embodiment.
Figure 4:
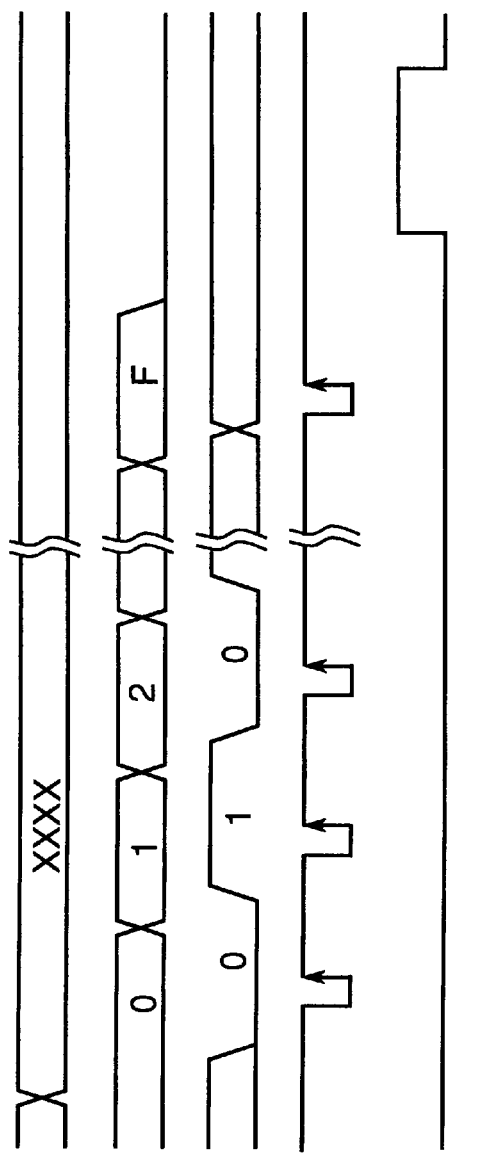
FIGS. 4A, 4B, 4C, 4D, and 4E are timing charts showing an example of the timing in an operation of the embodiment from the setting of N-address write data to the application of a write pulse.
Figure 5:
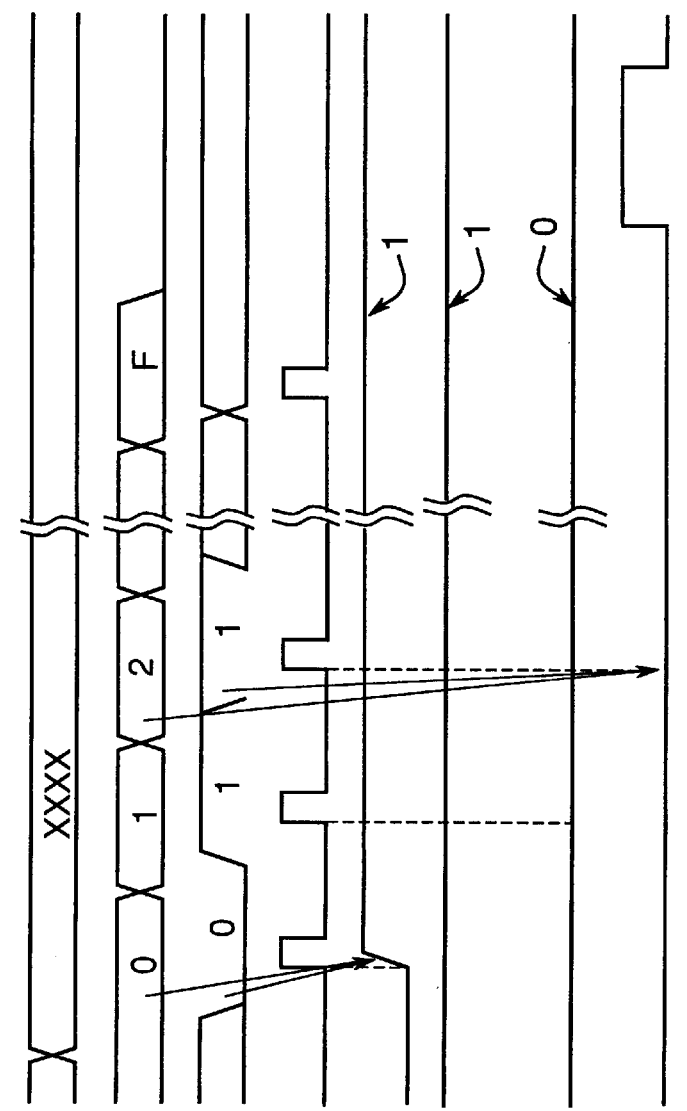
FIGS. 5A, 5B, 5C, 5D, 5E, 5F, 5G, and 5H are timing charts showing an example of the timing in another operation of the embodiment from the verifying of data for N addresses to process write data for use in additional write operation, to the application of an additional write pulse.
Figure 6:
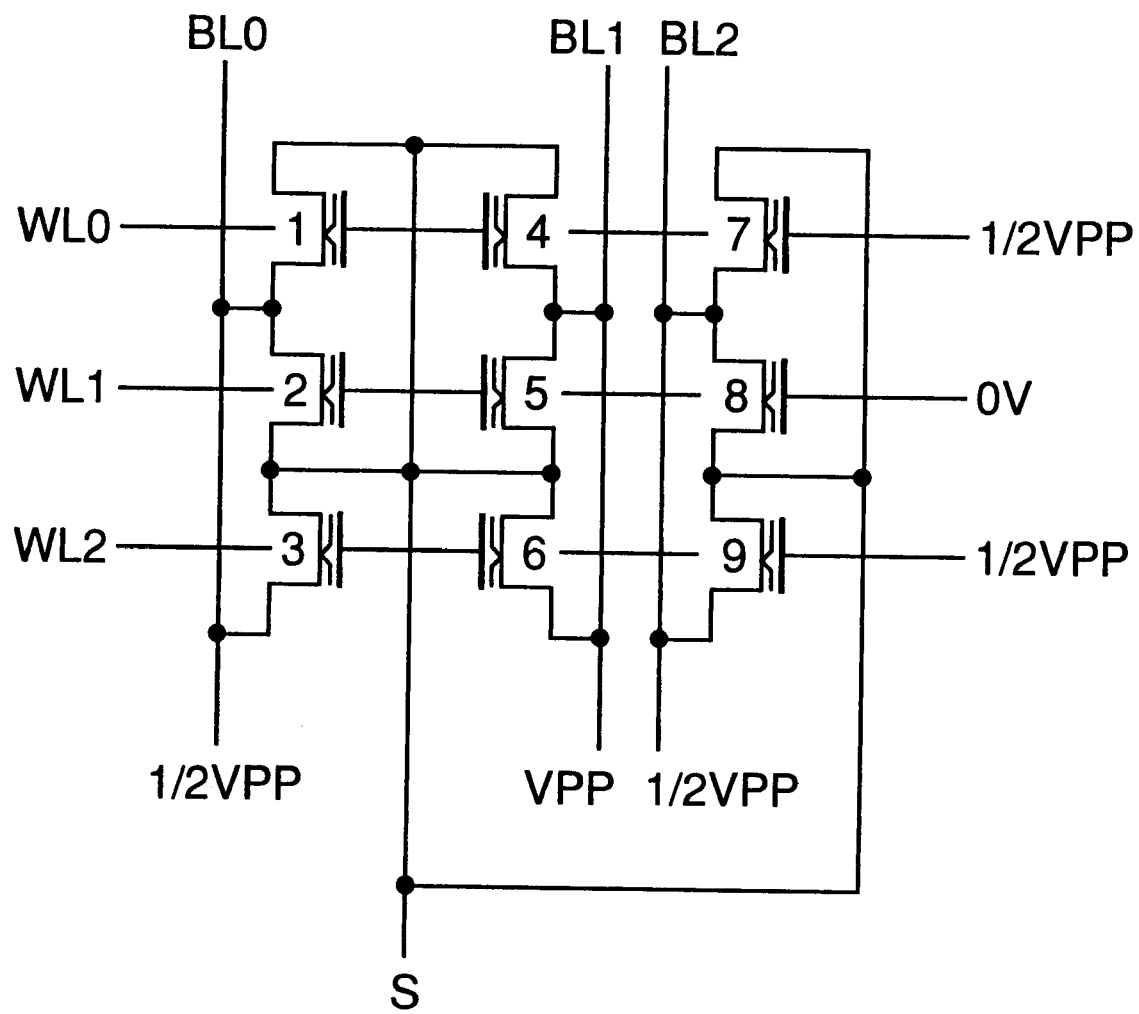
FIG. 6 is a circuit diagram for explaining write disturb in prior art.

Next, operation of this embodiment is explained with reference to the flow chart of FIG. 3 and the timing charts of FIGS. 4A to 4E and FIGS. 5A to 5H. FIG. 3 is a flow chart of the batch-write operation for N addresses in a nonvolatile memory. Steps S1 to S10 of this flow chart constitute the first and second control means as set forth in the claims.

First, at a start time the nonvolatile memory is in the erased state. In this embodiment, 16 addresses derived from the least significant 4 bits of the absolute addresses are associated with local 16 addresses (step S1).

Next, write data Indata-0 to Indata-7 are stored into the write data registers 7-0 to 7-F (step S2).

In this process, the write data registers 7-0 to 7-F do not need to recognize the absolute addresses Aad in the nonvolatile memory. The write data registers 7-0 to 7-F latch the write data Indata-0 to Indata-7 at falling of the latch timing signal DCK.

Each time the latch operation is performed, the local address Rad ("n") is incremented. Data storage into the eight units 8-0 to 8-7 in parallel is iterated sixteen times (N=16) from address 0 to address F in the order of the registers 7-0, 7-1, 7-2, 7-3, 7-4, 7-5, . . . , and 7-F (step S3). As a result of this, 16 (addresses)×8 (parallel bits)=128 pieces of data are stored into the 128 data registers 7-0 to 7-F.

FIGS. 4A–4E show an example in which data of parallel processing is "0". After each write data register 7-0 to 7-F has latched the data "0", the output signal Pulse-XX (i.e., Pulse-00, . . . , or Pulse-0F) shown in the circuit diagram of FIG. 1 becomes "1."

Specifically, in the example shown in FIGS. 4A to 4E, the data register 7-0 to which the local address Rad-0 is supplied makes the output signal Pulse-00 become "1", and the data register 7-2 to which the local address Rad-2 is supplied also makes the output signal Pulse-02 become "1". As a result of this, memory cells corresponding to the data registers 7-0, 7-2 become write-pulse enabled.

Next, a write pulse is applied from the writing circuit to the relevant memory cells (step S4). In this process, higher-order addresses over the 16 addresses represented by the local addresses Rad-0 to Rad-F need to be decoded by the absolute addresses of the memory. That is, the write pulse is applied to the memory cells that are included in the 16×8 memory cells selected by the higher-order address decoding and that have been write-pulse-enabled by the signal supplied from the write data registers 7-0 to 7-F.

Next, the program goes to step S5 to execute the verify operation. In this verify operation, memory data is output from the memory cells to the writing circuit with the decoding by the absolute addresses. More specifically, data corresponding to the absolute addresses Aad-0 to Aad-F is output from the relevant memory cells to the D flip-flop 1 as Outdata-0. Then, the output data (for example, outdata-0) from these memory cells is latched to the D flip-flop 1 at the timing of the latch clock signal VCK.

Then, at the pulse timing of the data processing timing signal VRFT, the output data latched to the D flip-flop 1 is compared with an expected write value in the write data register 7-0.

In this case, the lower-order absolute address Aad of the same value as the local address Rad is assigned to the NAND gate 4 serving as a comparator. Therefore, by performing the verify operation sixteen times from the lower-order absolute address 0 up to F, comparison is made between output data of the memory cells represented by the absolute addresses Aad and the data of the write data registers 7-0 to 7-F corresponding to the 16 addresses, with address matching.

FIGS. 5A to 5H show an example of comparison results in which write operation has been completed at the lower-order address 0 of the absolute address Aad, while write operation has not been completed at the lower-order address 2. The expected value at the lower-order address 0 is the value latched by the D flip-flop 3 corresponding to the local address 0. Because the expected value at the lower-order address 1 is "1", a write pulse is not applied from the beginning.

Now the processing of write data at step S7 is explained. With respect to address 0, at the pulse timing of the data processing timing signal VRFT, the absolute address Aad-0 is "1" and the memory output data Outdata-0 is "0". Therefore, the output of the NAND gate 4 goes "0" so that the D flip-flop 3 that is the register to store the data of address 0 is set. As a result of this, the signal Pulse-00 goes from "1" to "0", disabling the write pulse.

The writing progresses in the flow in which data reset is not performed before additional write operation. Therefore, the application of a write pulse from the write data register 7-0 to the relevant memory cell ends at this point.

Meanwhile, with respect to address 2, because the absolute address Aad-2 is "1" and the memory output data Outdata-2 is "1", the D flip-flop 3 serving as a data storage register in the data register 7-2 of the address 2 is not set, so that the stored data "0" of the D flip-flop 3 is maintained. Therefore, the addition signal Pulse-02 remains "1" so that a write pulse is applied once again in the additional write operation.

The above verify operation is executed in succession for sixteen addresses (steps S5, S6, S7, S8), and additional write operation is executed until all the output data Outdata from the relevant memory cells coincide with the respective expected values (steps S4 to S10). However, if a specified pulse count limit value for write operation is exceeded at step S10, this event is processed as a write failure.

As described above, in the additional write operation, control is performed so that the additional write pulse is not applied to the memory cells that have been completely written. Therefore, even if batch write operation is done on the 16×8-bit memory cells in the additional write operation as in the first write operation, there occurs no excessive writing.

In the way as described above, by iterating the foregoing operation until the writing of all the 16 addresses is completed, optimum write operation to all the memory cells corresponding to the 16 addresses can be accomplished with a minimum number of pulses. Also, by iterating the operation in the units of 16 addresses, optimum write operation can be accomplished for all the memory cells of the entire chip with a minimum number of pulses applied.

In the above embodiment, the operation timing signals including the latch clock signal VCK, the latch timing signal DCK and the data processing timing signal VRFT are generated by a control circuit (not shown) other than the circuit shown in FIG. 1.

As described above, according to this embodiment, in addition to the parallel processing to write the plural-bit memory cells, write processing for memory cells corresponding to the plural addresses is done simultaneously. In this process, in order to identify the address of memory cells when verifying the data of the memory cells, the write data registers are given their own address information (local addresses) for recognizing what place the relevant address takes among the plurality of addresses to be simultaneously processed. Then, the verify operation is executed, matching a part of the absolute address within the entire chip (for example, partial address represented by lower 4 bits of all the bits constituting the absolute address) with the local address. During this verify period, processing of write data is performed based on the verify result.

To sum up, by iterating the following operations (i) to (iv), write operation in a batch of a plurality of addresses and in plural-bit parallelism can be accomplished over the entire chip region: (i) simultaneous write operation to a plurality of addresses; (ii) verify operation every address for a relevant memory area (write data is processed during this verify period); (iii) additional write operation; and (iv) shifting to the next address area upon completion of the verify operation of all the addresses in the relevant area.

As described above, the writing circuit of the nonvolatile memory is provided with the write data registers each of which corresponds to a plurality of addresses having local addresses. Then, the write circuit executes the verify operation while matching part of the absolute address within the chip with the local address, and processes write data during the verify process. Thus, a large volume of data corresponding to a plurality of addresses can be simultaneously written to corresponding bits using an optimum number of write pulses.

For the data matching for 16 addresses, coincidence information may be stored outside the chip, or a circuit for counting the number of addresses that have been completely written may be provided inside the chip.

The above embodiment is equipped with 8×16 write data registers for holding 8-bit write data for 16 addresses in bit parallel fashion. However, the number of bits to be held in parallel with respect to each address (M, which is an integer.) may be other than 8, and the number of addresses (N, which is an integer.) for the batch processing may be other than 16. Thus, the number of registers for holding batch write data (M×N) may be other than 128 (8×16).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A writing circuit for nonvolatile memory capable of performing data input/output in M-bit parallelism (where M is an integer), comprising:

M data latch assemblies which each include N first data latches for N addresses (where N is an integer);

first control means for controlling the M data latch assemblies to hold in the first data latches M bits of write data fed in bit parallel fashion with respect to each of the N addresses;

M second data latches for simultaneously holding verify data of M bits read from memory cells; and means for generating an address decode signal by which each of the parallel M bits of write data is given N address attributes, in a verify operation.

2. The writing circuit for nonvolatile memory as defined in claim 1, further comprising:

second control means for comparing M×N pieces of write data held by the M×N first data latches with the verify data of M bits held by the M second data latches in an address sequence of the N address attributes and in M-bit parallelism, determining whether or not the write data is coincident with the verify data, and with respect to a first data latch that is holding the write data coincident with the verify data, canceling the holding of the write data and inhibiting the generation of a write pulse.

3. The writing circuit as defined in claim 1, wherein said address decode signal includes a local address decode signal and an absolute address decode signal.

4. A nonvolatile memory comprising:

a plurality of memory cells; and a writing circuit capable of performing data input/output in M-bit parallelism, said writing circuit being coupled to said plurality of memory cells and comprising:

M data latch assemblies which each include N first data latches for N addresses, where M and N are integers;

first control means for controlling said M data latch assemblies to hold in said N first data latches M-bits of write data fed in bit parallel fashion with respect to each of said N addresses;

M second data latches for simultaneously holding verify data of M-bits read from said plurality of memory cells; and means for generating an address decode signal by which each of the parallel M-bits of write data is given N address attributes in a verify operation.

5. A nonvolatile memory comprising:

a plurality of memory cells; and a writing circuit capable of performing data input/output in M-bit parallelism, said writing circuit being coupled to said plurality of memory cells and comprising;

M data latch assemblies which each include N first data latches for N addresses, where M and N are integers;

first control means for controlling said M data latch assemblies to hold in said N first data latches M-bits of write data fed in bit parallel fashion with respect to each of said N addresses;

M second data latches for simultaneously holding verify data of M-bits read from said plurality of memory cells;

means for generating an address decode signal by which each of the parallel M-bits of write data is given N address attributes in a verify operation; and second control means for comparing M×N pieces of write data held by said M×N first data latches with said verify data of M-bits held by said M second data latches in an address sequence of said N address attributes and in M-bit parallelism, determining whether or not said write data is coincident with said verify data, and with respect to a first data latch that is holding said write data coincident with said verify data, canceling said holding of said write data and inhibiting generation of a write pulse.

\* \* \* \* \*